United States Patent
Hirano et al.

(10) Patent No.: US 6,713,804 B2
(45) Date of Patent: Mar. 30, 2004

(54) TFT WITH A NEGATIVE SUBSTRATE BIAS THAT DECREASES IN TIME

(75) Inventors: Yuuichi Hirano, Tokyo (JP); Takuji Matsumoto, Tokyo (JP); Yasuo Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/199,173

(22) Filed: Jul. 22, 2002

(65) Prior Publication Data

US 2003/0042543 A1 Mar. 6, 2003

(30) Foreign Application Priority Data

Aug. 28, 2001 (JP) .......................................... 2001-257469

(51) Int. Cl.[7] ............................................. H01L 27/108
(52) U.S. Cl. .......................... 257/299; 257/347; 257/901
(58) Field of Search ................................... 257/347–352, 257/901, 299

(56) References Cited

U.S. PATENT DOCUMENTS

| | | | |
|---|---|---|---|
| 5,164,805 A | * | 11/1992 | Lee |
| 5,830,575 A | * | 11/1998 | Warren et al. |
| 6,049,110 A | | 4/2000 | Koh |
| 6,291,857 B1 | | 9/2001 | Hirano |
| 6,407,444 B1 | | 6/2002 | Shoga |

FOREIGN PATENT DOCUMENTS

| | | |
|---|---|---|
| JP | 10-12887 | 1/1998 |
| JP | 10-256556 | 9/1998 |
| JP | 11-150276 | 6/1999 |
| JP | 2000-299466 | 10/2000 |

* cited by examiner

*Primary Examiner*—Fetsum Abraham
(74) *Attorney, Agent, or Firm*—Oblon, Spivak, McClelland, Maier & Neustadt, P.C.

(57) ABSTRACT

A voltage applying section (32) is connected to a silicon substrate (1). Emission of radiation to a semiconductor device causes a large number of holes to accumulate within a BOX layer (2) in the vicinity of the interface with respect to a silicon layer (3). The amount of accumulation of holes increases with a lapse of time. A voltage applying section (32) applies a negative voltage which decreases with the lapse of time to the silicon substrate (1) in order to cancel out a positive electric field resulting from the accumulated holes. The voltage applying section (32) includes a time counter (30) for detecting the lapse of time and a voltage generating section (31) connected to the silicon substrate (1) for generating a negative voltage (V1) which decreases in proportion to the lapse of time based on the result of detection (time T) carried out by the time counter (30). Consequently, a semiconductor device capable of suppressing occurrence of total dose effects is obtained.

6 Claims, 8 Drawing Sheets

F I G. 1
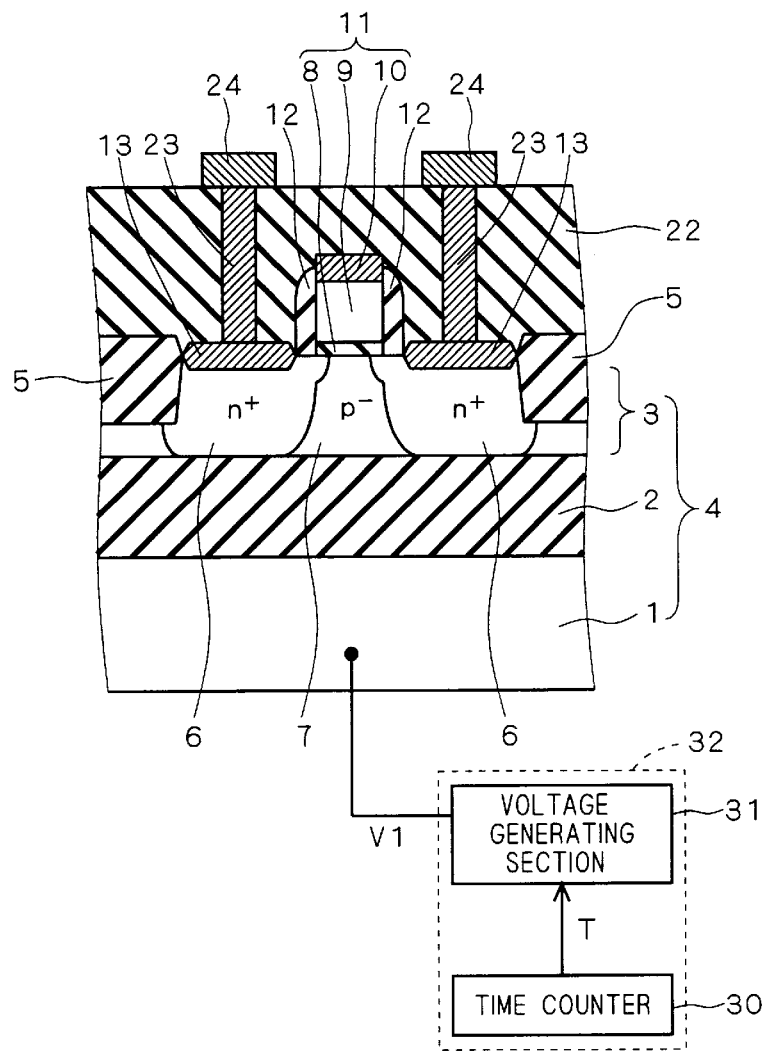
F I G. 2
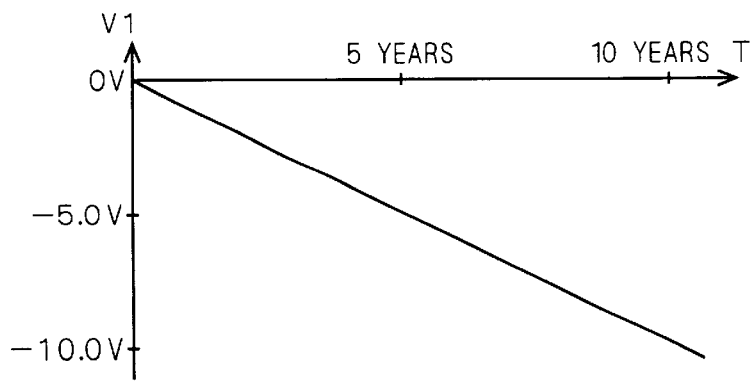

F/G. 11
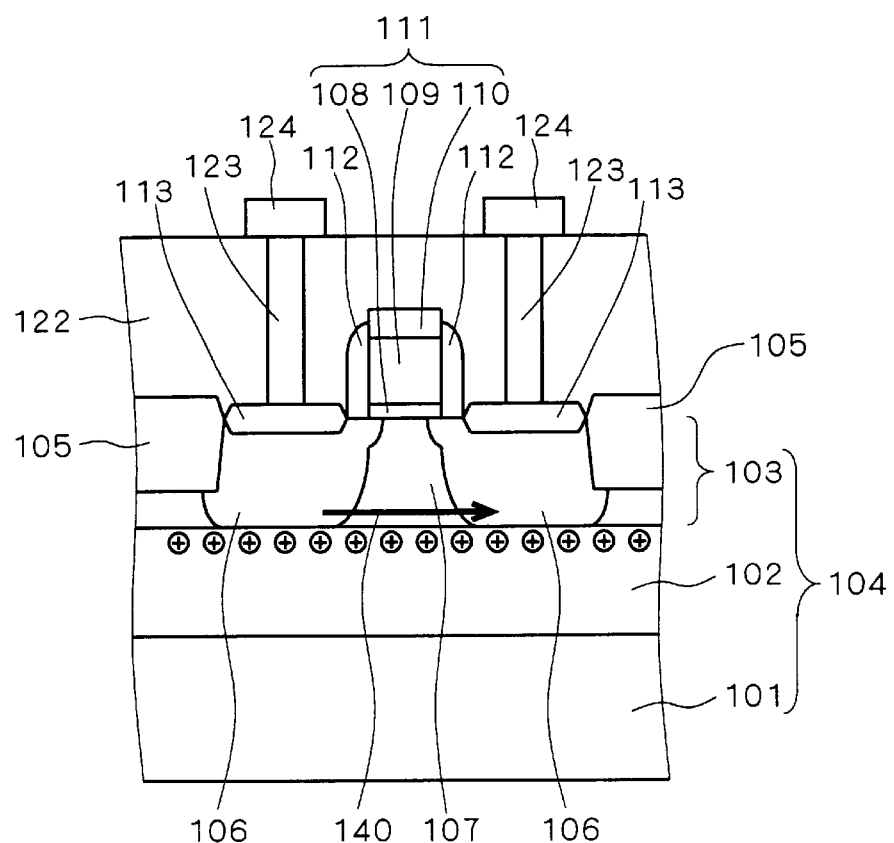

TFT WITH A NEGATIVE SUBSTRATE BIAS THAT DECREASES IN TIME

BACKGROUND OF THE INVENTION

1. Field of the Invention

The present invention relates to a structure of a semiconductor device using an SOI (Silicon-On-Insulator) substrate, and more particularly to a structure of a semiconductor device capable of suppressing occurrence of total dose effects.

2. Description of the Background Art

FIG. 9 is a sectional view showing a structure of a conventional semiconductor device. An SOI substrate 104 has a structure in which a silicon substrate 101, a BOX (Buried Oxide) layer 102 having a thickness of the order of several tens to several hundreds nanometers and a silicon layer 103 having a thickness of the order of several tens to several hundreds nanometers are laminated in this order. An element isolation insulating film 105 made of a silicon oxide film having a thickness of the order of several tens to several hundreds nanometers is partially formed in an upper surface of the silicon layer 103.

In FIG. 9, an NMOS transistor is formed in an element forming region defined by element isolation insulating films 105 positioned on the left and in the center, respectively. More particularly, a pair of source/drain regions 106 each being of n$^+$ type (approximately $1 \times 10^{20}$ cm$^{-3}$) are formed in the silicon layer 103. A body region 107 of p$^-$ type (approximately $1 \times 10^{18}$ cm$^{-3}$) is defined between the pair of source/drain regions 106. A gate structure 111 is formed on the body region 107. The gate structure 111 includes a gate insulating film 108 made of a silicon oxide film, a polysilicon layer 109 and a cobalt silicide layer 110 having a thickness of the order of several to several tens nanometers laminated in this order on the upper surface of the silicon layer 103. A sidewall 112 made of a silicon oxide film is formed on a side surface of the gate structure 111. A cobalt silicide layer 113 having a thickness of the order of several to several tens nanometers is formed on the source/drain regions 106 at an exposed part not covered by the gate structure 111 or the sidewall 112. Moreover, in FIG. 9, a PMOS transistor is formed in an element forming region defined by element isolation insulating films 105 positioned in the center and on the right, respectively. More particularly, a pair of source/drain regions 114 each being of p$^+$ type (approximately $1 \times 10^{20}$ cm$^{-3}$) are formed in the silicon layer 103. A body region 115 of n$^-$ type (approximately $1 \times 10^{18}$ cm$^{-3}$) is defined between the pair of source/drain regions 114. A gate structure 119 is formed on the body region 115. The gate structure 119 has a gate insulating film 116 made of a silicon oxide film, a polysilicon layer 117 and a cobalt silicide layer 118 having a thickness of the order of several to several tens nanometers laminated in this order on the upper surface of the silicon layer 103. A sidewall 120 made of a silicon oxide film is formed on a side surface of the gate structure 119. A cobalt silicide layer 121 having a thickness of the order of several to several tens nanometers is formed on the source/drain regions 114 at an exposed part not covered by the gate structure 119 or the sidewall 120.

Further, an interlayer insulating film 122 made of a silicon oxide film having a thickness of the order of several hundreds nanometers is formed in such a manner as to cover element isolation insulating films 105, the NMOS transistor and the PMOS transistor. An aluminum wiring 124 is formed on the interlayer insulating film 122. The aluminum wiring 124 is connected to the cobalt silicide layer 113 or 121 through a tungsten plug 123 formed in the interlayer insulating film 122.

FIGS. 10 and 11 are explanatory views of problems created in the conventional semiconductor device. More specifically, the drawings show the NMOS transistor in the structure shown in FIG. 9. In the case of using LSI in space and the like, an influence exerted by total dose effects needs to be taken into consideration. The total dose effects refer to a phenomenon in which a great amount of emission of radiation such as alpha rays or gamma rays affects the operational characteristics and reliability of a semiconductor device.

Referring to FIG. 10, emission of radiation 130 to the semiconductor device generates a large number of hole-electron pairs along the locus of the radiation 130 by ionization it performs. Among the hole-electron pairs generated in the BOX layer 102, the electrons of high mobility are emitted to the outside of the BOX layer 102 by an electric field. However, the holes of low mobility accumulate within the BOX layer 102 in the vicinity of the interface with respect to the silicon layer 103.

Referring to FIG. 11, accumulation of the holes within the BOX layer 102 in the vicinity of the interface with respect to the silicon layer 103 causes a problem in that a threshold voltage at the MOS transistor varies due to a positive electric field resulting from the accumulated holes. Further, there arises another problem in that a channel (back channel) is formed within the body region 107 in the vicinity of the interface with respect to the BOX layer 102 so that there flows a back channel current 140, resulting in an increase in power consumption.

SUMMARY OF THE INVENTION

An object of the present invention is to provide a semiconductor device capable of suppressing occurrence of total dose effects.

A first aspect of the present invention is directed to a semiconductor device comprising: an SOI substrate having a structure in which a supporting substrate, an insulation layer and a semiconductor layer are laminated in this order; a semiconductor element including a pair of source/drain regions formed in a main surface of the semiconductor layer, a body region defined between the pair of source/drain regions and a gate electrode formed on the main surface of the semiconductor layer with a gate insulating film interposed therebetween over the body region; and a voltage applying section applying a negative voltage which decreases with a lapse of time to the supporting substrate.

In the semiconductor device of the first aspect of the present invention, even in the case that emission of radiation causes accumulation of holes within the insulation layer in the vicinity of the interface with respect to the semiconductor layer, it is possible to cancel out a positive electric field resulting from the accumulated holes by the negative voltage applied to the supporting substrate by the voltage applying section. This, as a result, makes it possible to obtain a semiconductor device capable of suppressing occurrence of the total dose effects.

A second aspect of the present invention is directed to a semiconductor device comprising: an SOI substrate having a structure in which a supporting substrate, an insulation layer and a semiconductor layer are laminated in this order; a semiconductor element including a pair of source/drain regions formed in a main surface of the semiconductor layer, a body region defined between the pair of source/drain regions and a gate electrode formed on the main surface of the semiconductor layer with a gate insulating film interposed therebetween over the body region; and a voltage applying section applying a negative voltage which decreases with a lapse of time to the body region.

In the semiconductor device of the second aspect of the present invention, even in the case that emission of radiation causes accumulation of holes within the insulation layer in the vicinity of the interface with respect to the semiconductor layer, it is possible to cancel out a positive electric field resulting from the accumulated holes by the negative voltage applied to the body region by the voltage applying section. This, as a result, makes it possible to obtain a semiconductor device capable of suppressing occurrence of the total dose effects.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a structure of a semiconductor device according to a first preferred embodiment of the invention;

FIG. 2 is a graph showing an example of the relationship between time T and a voltage V1;

FIGS. 10 and 11 are explanatory views of problems in the conventional semiconductor device.

DESCRIPTION OF THE PREFERRED EMBODIMENTS

First Preferred Embodiment

Figure 3:
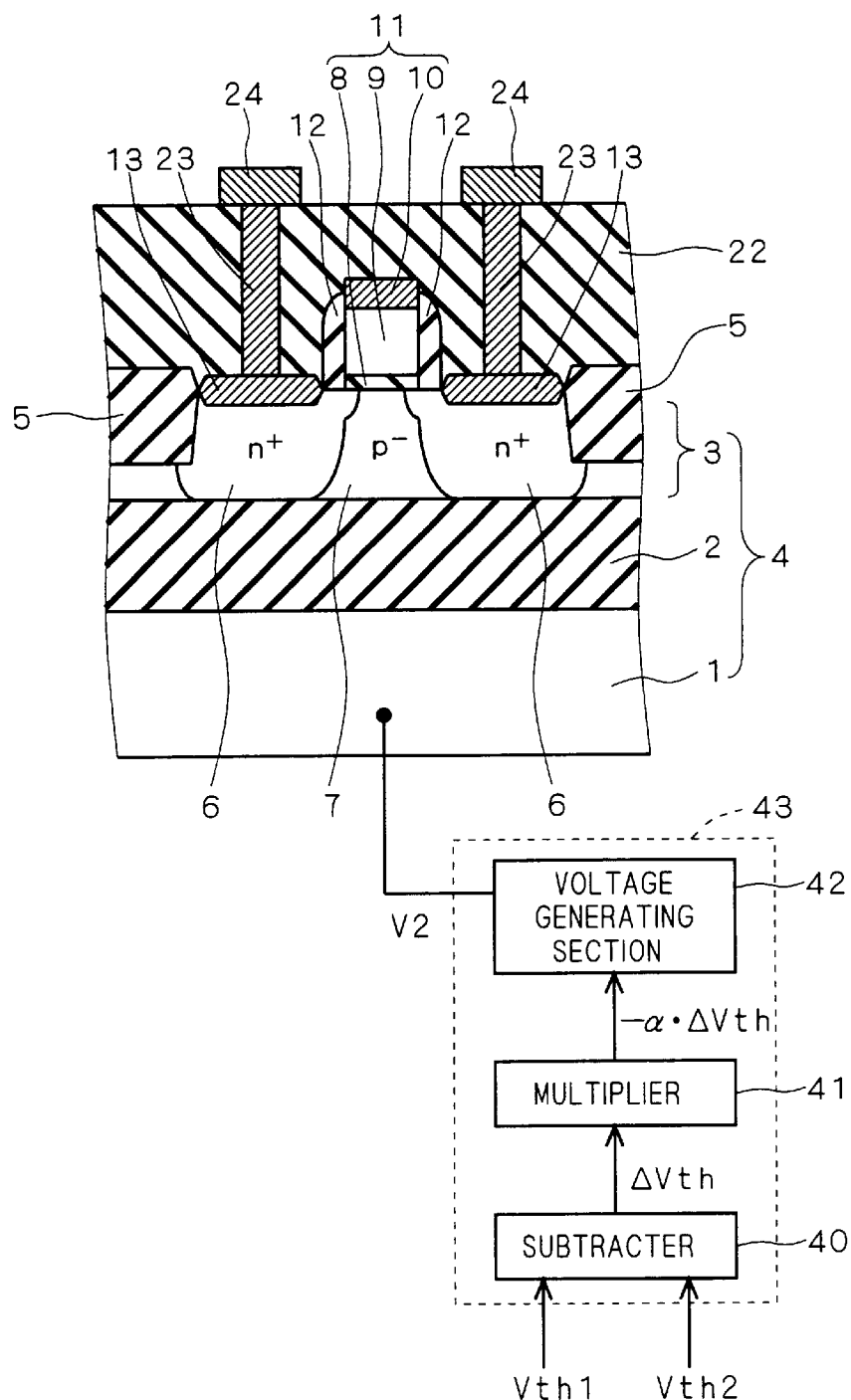
FIG. 3 shows a structure of a semiconductor device according to a second preferred embodiment of the invention.

FIG. 1 shows a structure of a semiconductor device according to the first preferred embodiment of the invention. An SOI substrate 4 has a structure in which a silicon substrate 1 serving as a supporting substrate, a BOX (Buried Oxide) layer 2 serving as an insulation layer having a thickness of the order of several tens to several hundreds nanometers and a silicon layer 3 serving as a semiconductor layer having a thickness of the order of several hundreds nanometers are laminated in this order. An element isolation insulating film 5 made of a silicon oxide film having a thickness of the order of several tens to several hundreds nanometers is partially formed in an upper surface of the silicon layer 3.

An NMOS transistor is formed in an element forming region defined by element isolation insulating films 5. More particularly, a pair of source/drain regions 6 each being of $n^+$ type (approximately $1 \times 10^{20}$ $cm^{-3}$) are formed in the silicon layer 3. A body region 7 of $p^-$ type (approximately $1 \times 10^{18}$ $cm^{-3}$) is defined between the pair of source/drain regions 6.

A gate structure 11 is formed on the body region 7. The gate structure 11 includes a gate insulating film 8 made of a silicon oxide film, a polysilicon layer 9 and a cobalt silicide layer 10 having a thickness of the order of several to several tens nanometers laminated in this order on the upper surface of the silicon layer 3. A sidewall 12 made of a silicon oxide film is formed on a side surface of the gate structure 11. A cobalt silicide layer 13 having a thickness of the order of several to several tens nanometers is formed on the source/drain regions 6 at an exposed part not covered by the gate structure 11 or the sidewall 12.

Further, an interlayer insulating film 22 made of a silicon oxide film having a thickness of the order of several hundreds nanometers is formed in such a manner as to cover the element isolation insulating films 5 and the NMOS transistor. An aluminum wiring 24 is formed on the interlayer insulating film 22. The aluminum wiring 24 is connected to the cobalt silicide layer 13 through a tungsten plug 23 formed in the interlayer insulating film 22.

The element isolation insulating films 5 of the semiconductor device shown in FIG. 1 are of so-called partial isolation type, and part of the silicon layer 3 is present between a bottom surface of an element isolation insulating film 5 and an upper surface of the BOX layer 2. Therefore, it is possible to apply voltage of a predetermined value to the body region 7 through this part of the silicon layer 3.

A voltage applying section 32 is connected to the silicon substrate 1. The voltage applying section 32 includes a voltage generating section 31 and a time counter 30. The voltage applying section 32 may be formed within the SOI substrate 4 or within another substrate different from the SOI substrate 4.

As discussed in Description of the Background Art, emission of radiation to a semiconductor device causes a large number of holes to accumulate within the BOX layer 2 in the vicinity of the interface with respect to the silicon layer 3. The amount of accumulation of holes increases with a lapse of time. The voltage applying section 32 applies a negative voltage which decreases with the lapse of time to the silicon substrate 1 in order to cancel out a positive electric field resulting from the accumulated holes. The voltage applying section 32 according to the present embodiment includes the time counter 30 which is already known for detecting the lapse of time and the voltage generating section 31 connected to the silicon substrate 1 for generating a negative voltage V1 which decreases in proportion to the lapse of time based on the result of detection (time T) carried out by the time counter 30. The degree of increase in the amount of accumulation of holes with the lapse of time varies depending on the environment in which the semiconductor device is used, and the like. Therefore, the degree of increase in the amount of accumulation of holes is obtained in advance by a general rule, an experiment or the like, and according to the obtained degree, the degree of decrease in the voltage V1 is determined.

FIG. 2 is a graph showing an example of the relationship between time T and the voltage V1. As is apparent from the graph, the value of the voltage V1 decreases in proportion to an increase in the value of the time T. In the example shown in FIG. 2, the value of the voltage V1 becomes −5.0V after a lapse of 5 years, and −10.0V after 10 years.

In the semiconductor device according to the present embodiment as described above, even in the case that the emission of radiation causes holes to accumulate within the BOX layer 2 in the vicinity of the interface with respect to the silicon layer 3, it is possible to cancel out the positive electric field resulting from the accumulated holes by the negative voltage applied to the silicon substrate 1 by the voltage applying section 32. This, as a result, makes it possible to obtain a semiconductor device capable of suppressing occurrence of the total dose effects.

Further, since the amount of accumulation of holes increases in proportion to a lapse of time, generating the negative voltage V1 which decreases in proportion to the lapse of time by the voltage generating section 31 and applying it to the silicon substrate 1 allows occurrence of the total dose effects to be appropriately suppressed.

Second Preferred Embodiment

FIG. 3 shows a structure of a semiconductor device according to the second preferred embodiment of the invention. An MOS transistor according to the present embodiment has a structure similar to that of the MOS transistor of the first preferred embodiment. A voltage applying section 43 is connected to the silicon substrate 1. The voltage applying section 43 includes a subtracter 40, a multiplier 41 and a voltage generating section 42. The voltage applying section 43 may be formed within the SOI substrate 4 or within another substrate different from the SOI substrate 4.

As described above, emission of radiation to the semiconductor device causes accumulation of a large number of holes within the BOX layer 2 in the vicinity of the interface with respect to the silicon layer 3 and causes a variation in the threshold voltage at the MOS transistor. The amount of accumulation of holes increases with a lapse of time and the variation in the threshold voltage correspondingly increases. The voltage applying section 43 applies a negative voltage to the silicon substrate 1 for canceling out the variation in the threshold voltage resulting from the accumulated holes. The voltage applying section 43 according to the present embodiment includes the subtracter 40 for detecting a decrease in the threshold voltage resulting from the lapse of time and the voltage generating section 42 connected to the silicon substrate 1 for generating a negative voltage V2 for canceling out the decrease in the threshold voltage based on the result of detection carried out by the subtracter 40.

Inputted to the subtracter 40 are: a fixed voltage Vth1 corresponding to the threshold voltage at an initial stage (without a lapse of time) from a voltage generating circuit not shown; and a current threshold voltage Vth2 after a certain period of time. The subtracter 40 calculates a difference between the values (Vth1−Vth2) by subtraction to output a variation ΔVth in the threshold voltage as the result of subtraction. The variation ΔVth is inputted to the multiplier 41 from the subtracter 40, and the multiplier 41 multiplies the variation ΔVth with a predetermined negative multiplier (−α) to output −α·ΔVth as the result of multiplication. The value of the multiplier (−α) is determined in advance by a general rule, an experiment or the like in accordance with the structure, characteristics or the like of the MOS transistor, and is set at a value of the order of, for example, 1 to 1000. The result of multiplication −α·ΔVth is inputted to the voltage generating section 42 from the multiplier 41, and the voltage generating section 42 generates the negative voltage V2 given by the result of multiplication −α·ΔVth.

Figure 4:
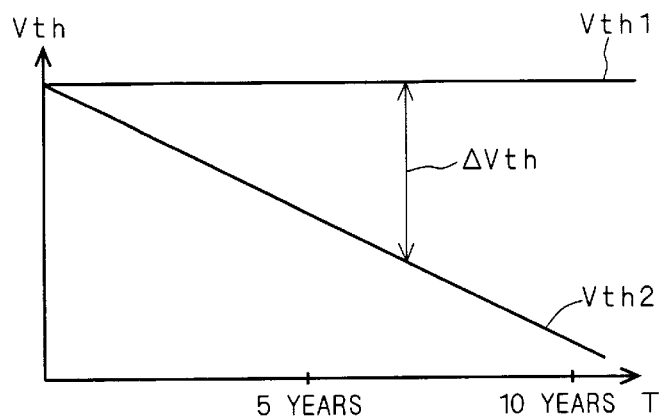
FIG. 4 is a graph showing an example of the relationship between time T and a variation ΔVth in a threshold voltage.

FIG. 4 is a graph showing an example of the relationship between time T and the variation ΔVth in the threshold voltage. As is apparent from FIG. 4, the threshold voltage Vth2 decreases and the variation ΔVth in the threshold voltage increases in proportion to an increase in the value of the time T.

Figure 5:
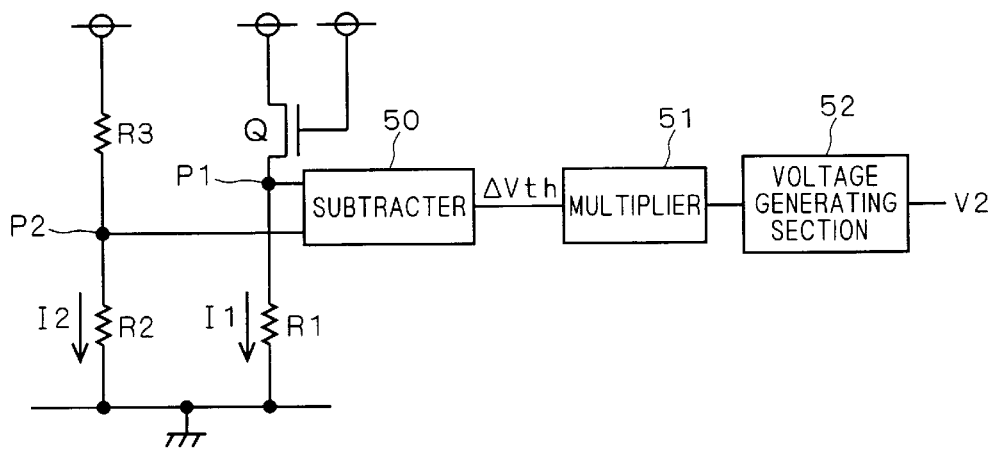
FIG. 5 shows a structure of a voltage applying section.

FIG. 5 shows another structure of the voltage applying section 43. A series connection point P1 between an MOS transistor Q and a resistance R1 is connected to one of input terminals of a subtracter 50. A series connection point P2 between a resistance R2 and a resistance R3 is connected to the other of the input terminals. The resistances R1 to R3 are determined to have such resistance values that R1·I1=R2·I2 in an initial state of the MOS transistor Q (without a lapse of time). As time progresses, a threshold voltage of the MOS transistor Q decreases due to the accumulation of holes. This causes current I1 flowing in the MOS transistor Q to increase, resulting in an increase in the value of R1·I1. The subtracter 50 performs a subtraction of R1·I1−R2·I2 to output ΔVth (=R1·I1−R2·I2) as the result of subtraction. The multiplier 51 multiplies the above result of subtraction ΔVth with the above multiplier (−α) to be inputted to a voltage generating section 52. The voltage generating section 52 generates the negative voltage V2.

In the semiconductor device according to the present embodiment as described above, even in the case that the emission of radiation causes accumulation of holes within the BOX layer 2 in the vicinity of the interface with respect to the silicon layer 3 and causes a variation in the threshold voltage at the MOS transistor, it is possible to cancel out the variation in the threshold voltage by the negative voltage applied to the silicon substrate 1 by the voltage applying section 43. This, as a result, makes it possible to obtain a semiconductor device capable of suppressing occurrence of the total dose effects.

Further, the subtracter 50 detects the variation in the threshold voltage at the MOS transistor, and the voltage generating section 52 generates the negative voltage V2 for canceling out the variation in the threshold voltage based on the detected variation ΔVth. This allows occurrence of the total dose effects to be appropriately suppressed.

Third Preferred Embodiment

Figure 6:
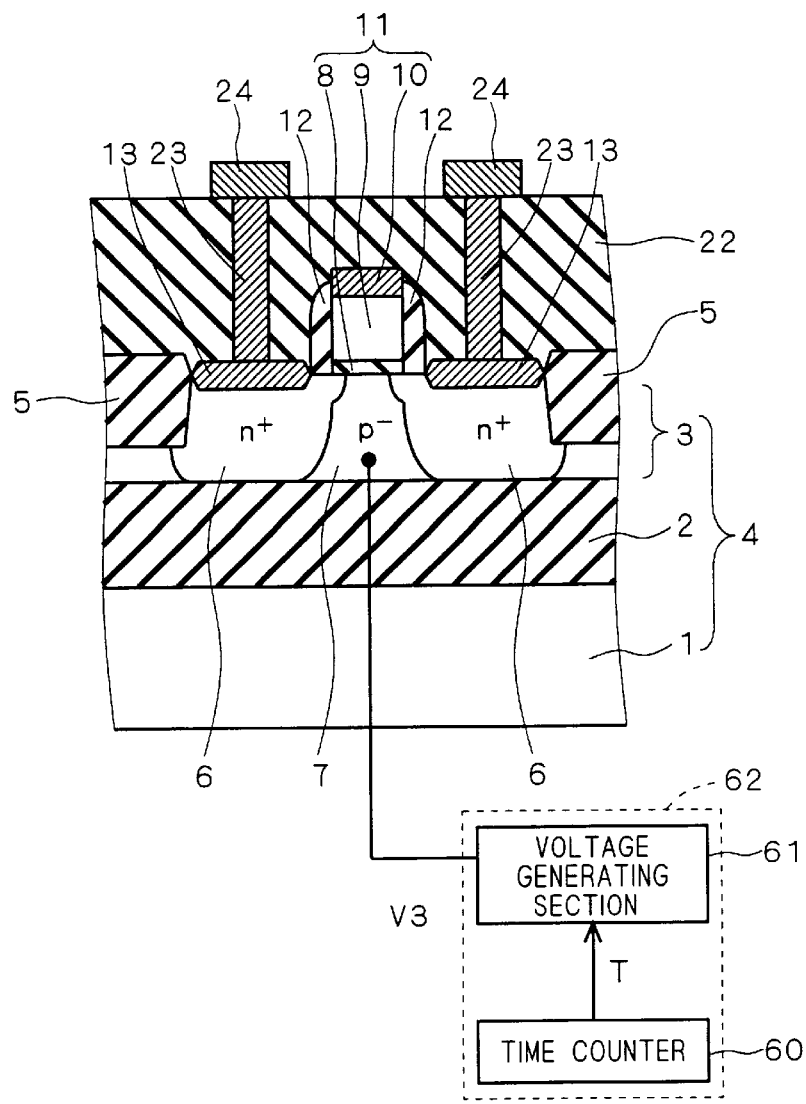
FIG. 6 shows a structure of a semiconductor device according to a third preferred embodiment of the invention.

FIG. 6 shows a structure of a semiconductor device according to the third preferred embodiment of the invention. An MOS transistor according to the present embodiment has a structure similar to that of the MOS transistor of the first preferred embodiment. A voltage applying section 62 is connected to the body region 7. The voltage applying section 62 may be formed within the SOI substrate 4 or within another substrate different from the SOI substrate 4.

As described above, emission of radiation to the semiconductor device causes a large number of holes to accumulate within the BOX layer 2 in the vicinity of the interface with respect to the silicon layer 3. The amount of accumulation of holes increases with a lapse of time. The voltage applying section 62 applies a negative voltage which decreases with the lapse of time to the body region 7 in order to cancel out a positive electric field resulting from the accumulated holes. The voltage applying section 62 according to the present embodiment includes a time counter 60 for detecting the lapse of time and a voltage generating section 61 connected to the body region 7 for generating a negative voltage V3 which decreases in proportion to the lapse of time based on the result of detection (time T) carried out by the time counter 60.

Figure 7:
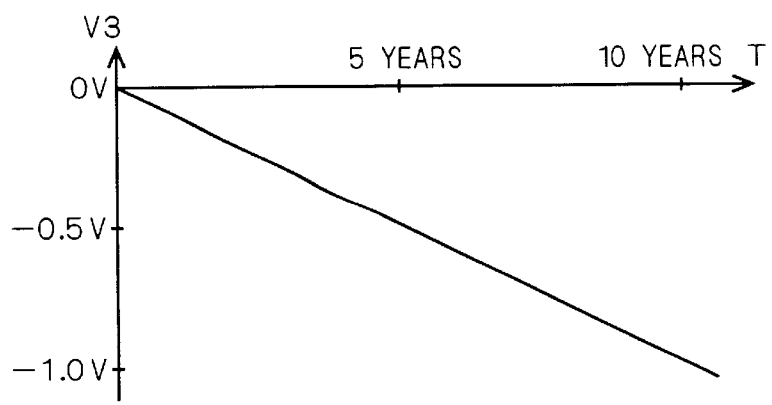
FIG. 7 is a graph showing an example of the relationship between time T and a voltage V3.

FIG. 7 is a graph showing an example of the relationship between time T and the voltage V3. As is apparent from the graph, the value of the voltage V3 decreases in proportion to an increase in the value of the time T. In the example shown in FIG. 7, the value of the voltage V3 becomes −0.5V after a lapse of 5 years, and −1.0V after 10 years.

In the semiconductor device according to the present embodiment as described above, even in the case that the emission of radiation causes accumulation of holes within the BOX layer 2 in the vicinity of the interface with respect to the silicon layer 3, it is possible to cancel out the positive electric field resulting from the accumulated holes by the negative voltage applied to the body region 7 by the voltage applying section 62. This, as a result, makes it possible to obtain a semiconductor device capable of suppressing occurrence of the total dose effects.

Further, since the amount of accumulation of holes increases in proportion to a lapse of time, generating the negative voltage V3 which decreases in proportion to the lapse of time by the voltage generating section 61 and applying it to the body region 7 allows occurrence of the total dose effects to be appropriately suppressed.

Fourth Preferred Embodiment

Figure 8:
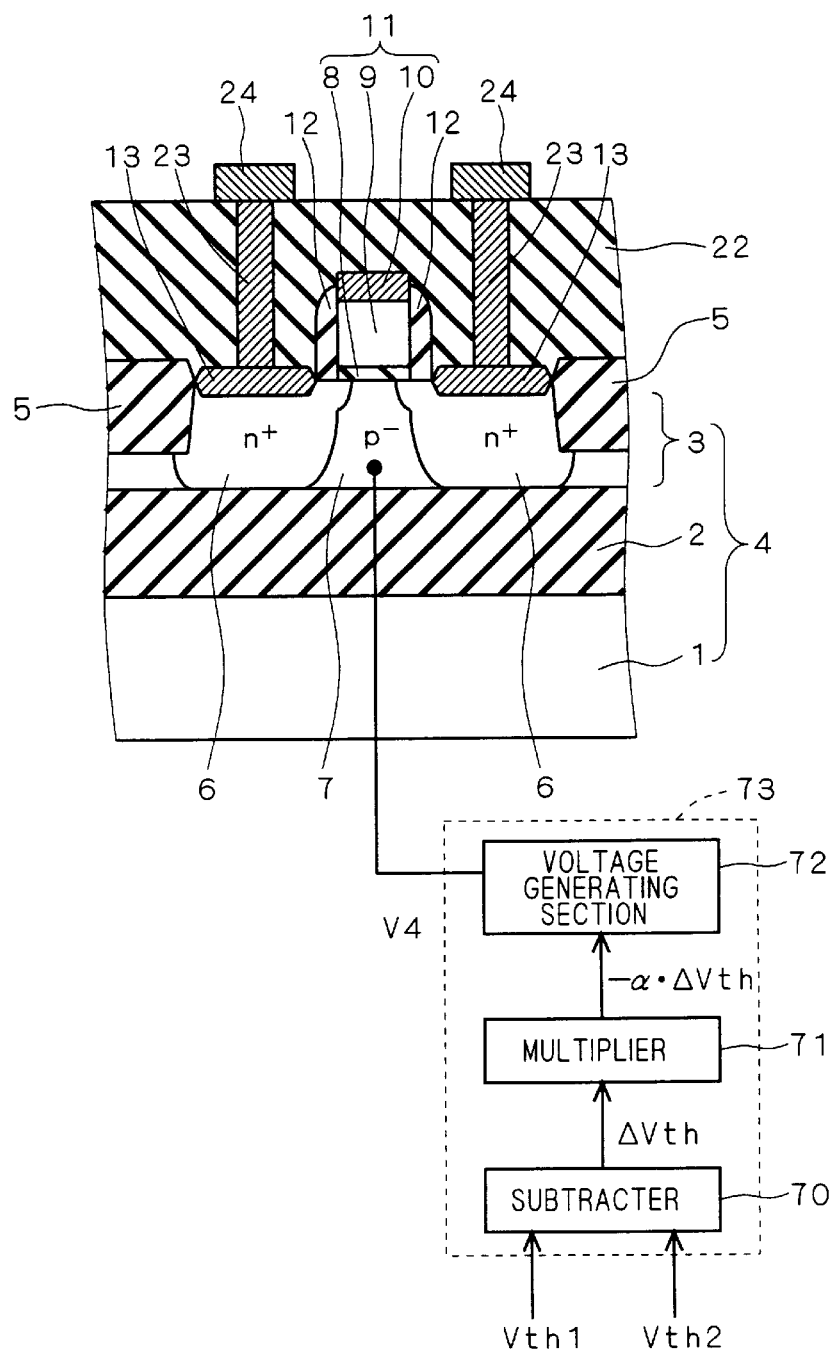
FIG. 8 shows a structure of a semiconductor device according to a fourth preferred embodiment of the invention.
Figure 9:
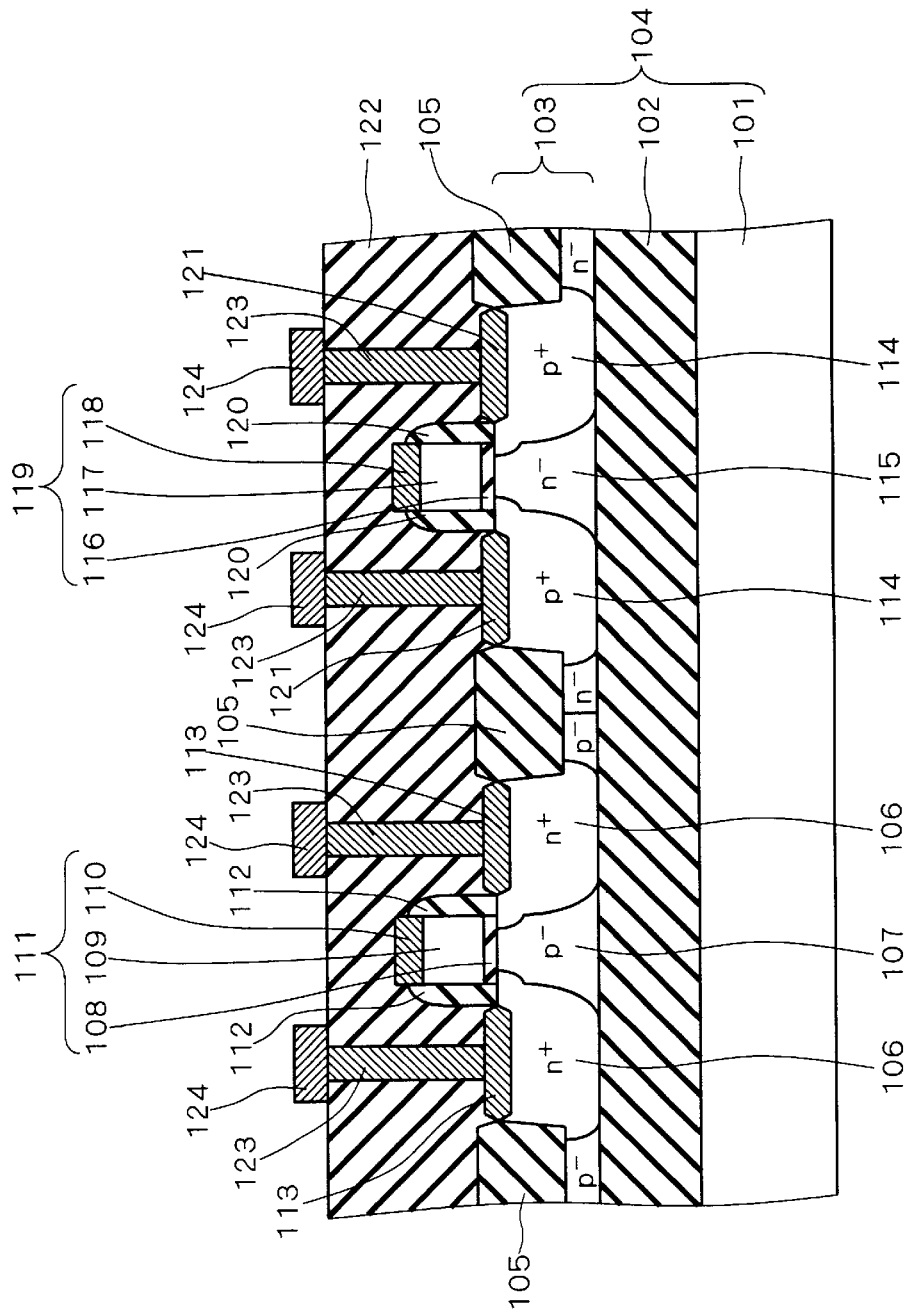
FIG. 9 is a sectional view showing a structure of a conventional semiconductor device.
Figure 10:
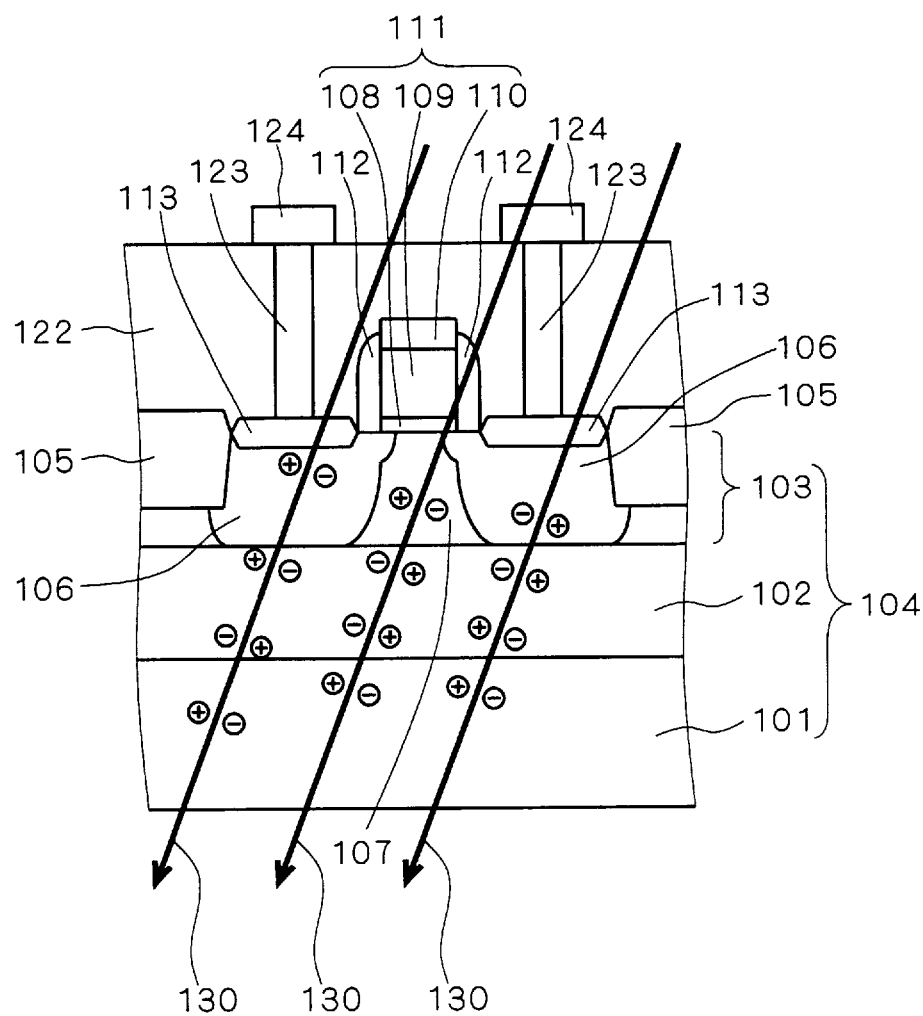

FIG. 8 shows a structure of a semiconductor device according to the fourth preferred embodiment of the invention. An MOS transistor according to the present embodiment has a structure similar to that of the MOS transistor of the first preferred embodiment. A voltage applying section 73 is connected to the body region 7. The voltage applying section 73 may be formed within the SOI substrate 4 or within another substrate different from the SOI substrate 4.

As described above, emission of radiation to the semiconductor device causes accumulation of a large number of holes within the BOX layer 2 in the vicinity of the interface with respect to the silicon layer 3 and causes a variation in the threshold voltage at the MOS transistor. The amount of accumulation of holes increases with a lapse of time and the variation in the threshold voltage correspondingly increases. The voltage applying section 73 applies a negative voltage to the body region 7 for canceling out the variation in the threshold voltage resulting from the accumulated holes. The voltage applying section 73 according to the present embodiment includes a subtracter 70 for detecting a decrease in the threshold voltage resulting from the lapse of time and a voltage generating section 72 connected to the body region 7 for generating a negative voltage V4 for canceling out the decrease in the threshold voltage based on the result of detection carried out by the subtracter 70.

Inputted to the subtracter 70 are: the fixed voltage Vth1 corresponding to the threshold voltage at an initial stage (without a lapse of time); and the current threshold voltage Vth2 after a certain period of time. The subtracter 70 calculates a difference between the values (Vth1−Vth2) by subtraction to output the variation ΔVth in the threshold voltage as the result of subtraction. The variation ΔVth is inputted to the multiplier 71 from the subtracter 70, and the multiplier 71 multiplies the variation ΔVth with the predetermined negative multiplier (−α) to output −α·ΔVth as the result of multiplication. The value of the multiplier (−α) is determined in advance by a general rule, an experiment or the like in accordance with the structure, characteristics or the like of the MOS transistor, and is set at a value of the order of, for example, 1 to 100. The result of multiplication −α·ΔVth is inputted to the voltage generating section 72 from the multiplier 71, and the voltage generating section 72 generates the negative voltage V4 given by the result of multiplication −α·ΔVth.

The relationship between time T and the variation ΔVth in the threshold voltage is as that shown in the example of FIG. 4. The structure of a circuit for detecting the value of the threshold voltage Vth2 is as that shown in the example of FIG. 5.

In the semiconductor device according to the present embodiment as described above, even in the case that the emission of radiation causes accumulation of holes within the BOX layer 2 in the vicinity of the interface with respect to the silicon layer 3 and causes a variation in the threshold voltage at the MOS transistor, it is possible to cancel out the variation in the threshold voltage by the negative voltage applied to the body region 7 by the voltage applying section 73. This, as a result, makes it possible to obtain a semiconductor device capable of suppressing occurrence of the total dose effects.

Further, the subtracter 70 detects the variation in the threshold voltage at the MOS transistor, and the voltage generating section 72 generates the negative voltage V4 for canceling out the variation in the threshold voltage based on the variation ΔVth. This allows occurrence of the total dose effects to be appropriately suppressed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

an SOI substrate having a structure in which a supporting substrate, an insulation layer and a semiconductor layer are laminated in this order;

a semiconductor element including a pair of source/drain regions formed in a main surface of said semiconductor layer, a body region defined between said pair of source/drain regions and a gate electrode formed on said main surface of said semiconductor layer with a gate insulating film interposed therebetween over said body region; and a voltage applying section applying a negative voltage which decreases with a lapse of time to said supporting substrate.

2. The semiconductor device according to claim 1, wherein said voltage applying section includes:

a detecting section detecting a lapse of time; and a voltage generating section connected to said supporting substrate, generating said negative voltage which decreases in proportion to said lapse of time based on a result of detection carried out by said detecting section.

3. The semiconductor device according to claim 1, wherein said voltage applying section includes:

a detecting section detecting a variation in a threshold voltage at said semiconductor element resulting from a lapse of time; and a voltage generating section connected to said supporting substrate, generating said negative voltage which cancels out said variation in said threshold voltage based on a result of detection carried out by said detecting section.

4. A semiconductor device comprising:

an SOI substrate having a structure in which a supporting substrate, an insulation layer and a semiconductor layer are laminated in this order;

a semiconductor element including a pair of source/drain regions formed in a main surface of said semiconductor layer, a body region defined between said pair of source/drain regions and a gate electrode formed on said main surface of said semiconductor layer with a gate insulating film interposed therebetween over said body region; and a voltage applying section applying a negative voltage which decreases with a lapse of time to said body region.

5. The semiconductor device according to claim 4, wherein
   said voltage applying section includes:
   a detecting section detecting a lapse of time; and
   a voltage generating section connected to said body region, generating said negative voltage which decreases in proportion to said lapse of time based on a result of detection carried out by said detecting section.

6. The semiconductor device according to claim 4, wherein
   said voltage applying section includes:
   a detecting section detecting a variation in a threshold voltage at said semiconductor element resulting from a lapse of time; and
   a voltage generating section connected to said body region, generating said negative voltage which cancels out said variation in said threshold voltage based on a result of detection carried out by said detecting section.

* * * * *